US011181556B2

(12) United States Patent
Pion et al.

(10) Patent No.: US 11,181,556 B2
(45) Date of Patent: Nov. 23, 2021

(54) PORTABLE DEVICE FOR CURRENT MEASUREMENT USING INDUCED MAGNETIC FIELDS

(71) Applicant: CHAUVIN ARNOUX, Asnieres-sur-Seine (FR)

(72) Inventors: Francisque Pion, Asnieres-sur-Seine (FR); Marouane Ait El Faqir, Asnieres-sur-Seine (FR)

(73) Assignee: CHAUVIN ARNOUX, Asnieres-sur Seine (FR)

( * ) Notice: Subject to any disclaimer, the term of this patent is extended or adjusted under 35 U.S.C. 154(b) by 0 days.

(21) Appl. No.: 17/103,087

(22) Filed: Nov. 24, 2020

(65) Prior Publication Data
US 2021/0156892 A1 May 27, 2021

(30) Foreign Application Priority Data

Nov. 26, 2019 (FR) ...................................... 1913250

(51) Int. Cl.
*G01R 15/20* (2006.01)
*G01R 33/00* (2006.01)

(52) U.S. Cl.
CPC ......... *G01R 15/202* (2013.01); *G01R 15/207* (2013.01); *G01R 33/0023* (2013.01)

(58) Field of Classification Search
CPC  G01R 15/202; G01R 15/207; G01R 33/0023; G01R 15/205; G01R 19/0092; G01R 15/148; G01R 33/0206; B64G 1/366

USPC .................................. 324/117 H, 117 R, 244
See application file for complete search history.

(56) References Cited

U.S. PATENT DOCUMENTS

| 2018/0014738 A1* | 1/2018 | Tanaka ................. G01R 33/022 |
| 2019/0146009 A1 | 5/2019 | Blanchard, III et al. |
| 2019/0293689 A1* | 9/2019 | Lerner ................. G01R 33/096 |

FOREIGN PATENT DOCUMENTS

WO       2013051567 A1       4/2013

OTHER PUBLICATIONS

Search Report from corresponding French Application No. FR1913250, dated Jul. 28, 2020.

* cited by examiner

*Primary Examiner* — Tung X Nguyen
*Assistant Examiner* — Robert P Alejnikov, Jr.
(74) *Attorney, Agent, or Firm* — Workman Nydegger

(57) ABSTRACT

Portable device for a contactless measurement of a current passing through an electrical conductor, the device including a measuring module and a processing module, the measuring module, configured to be held by an operator in contact with the conductor in a plane substantially orthogonal to this conductor and without clamping this conductor, including one or two pluralities of magnetic field sensors, and the processing module being configured to perform a determined linear combination of the plurality of signals delivered by one or the two pluralities of magnetic field sensors, so as to perform an angular spatial filtering isolating the current to be measured from other disturbing currents passing through other conductors.

12 Claims, 4 Drawing Sheets

[Fig. 1]
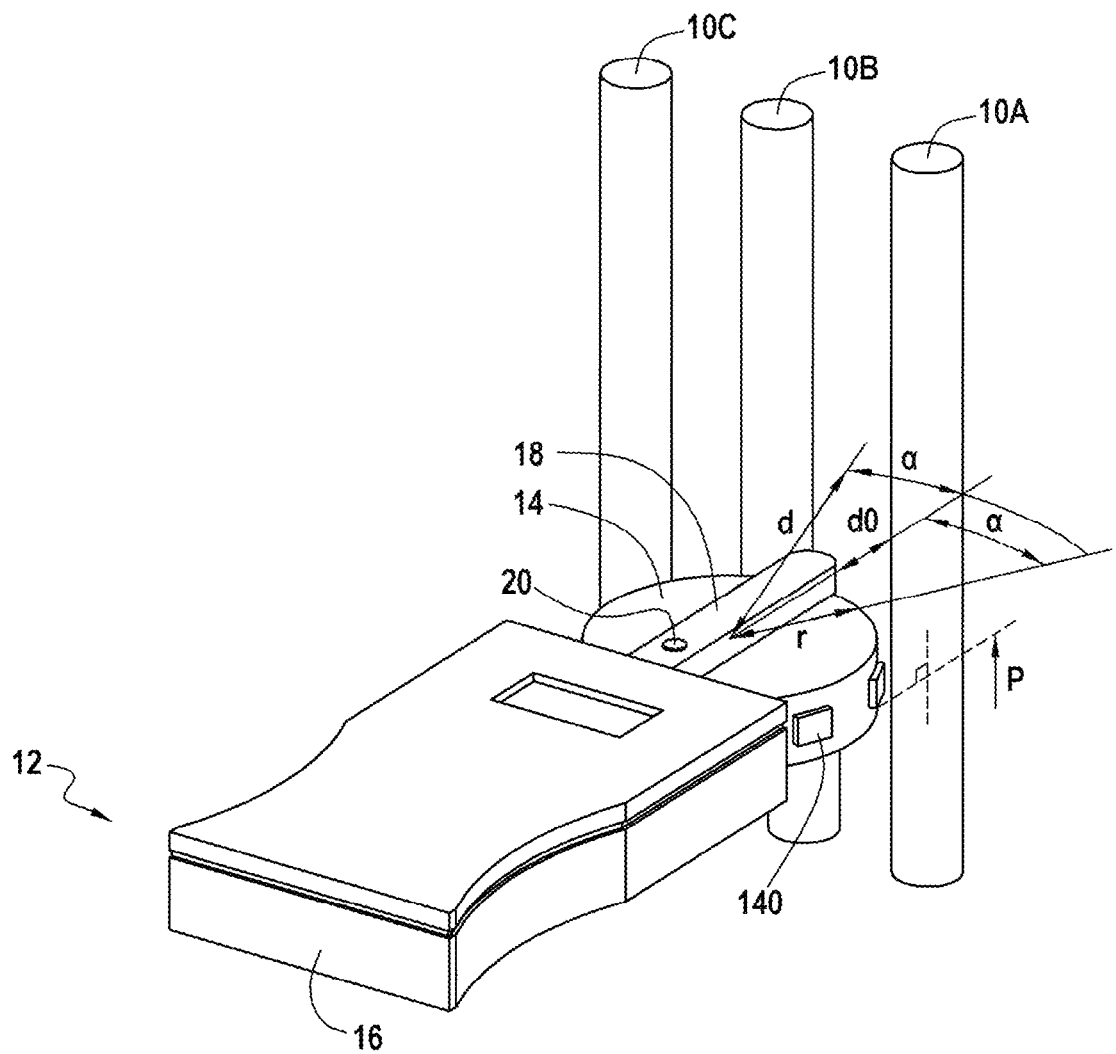

[Fig. 2]
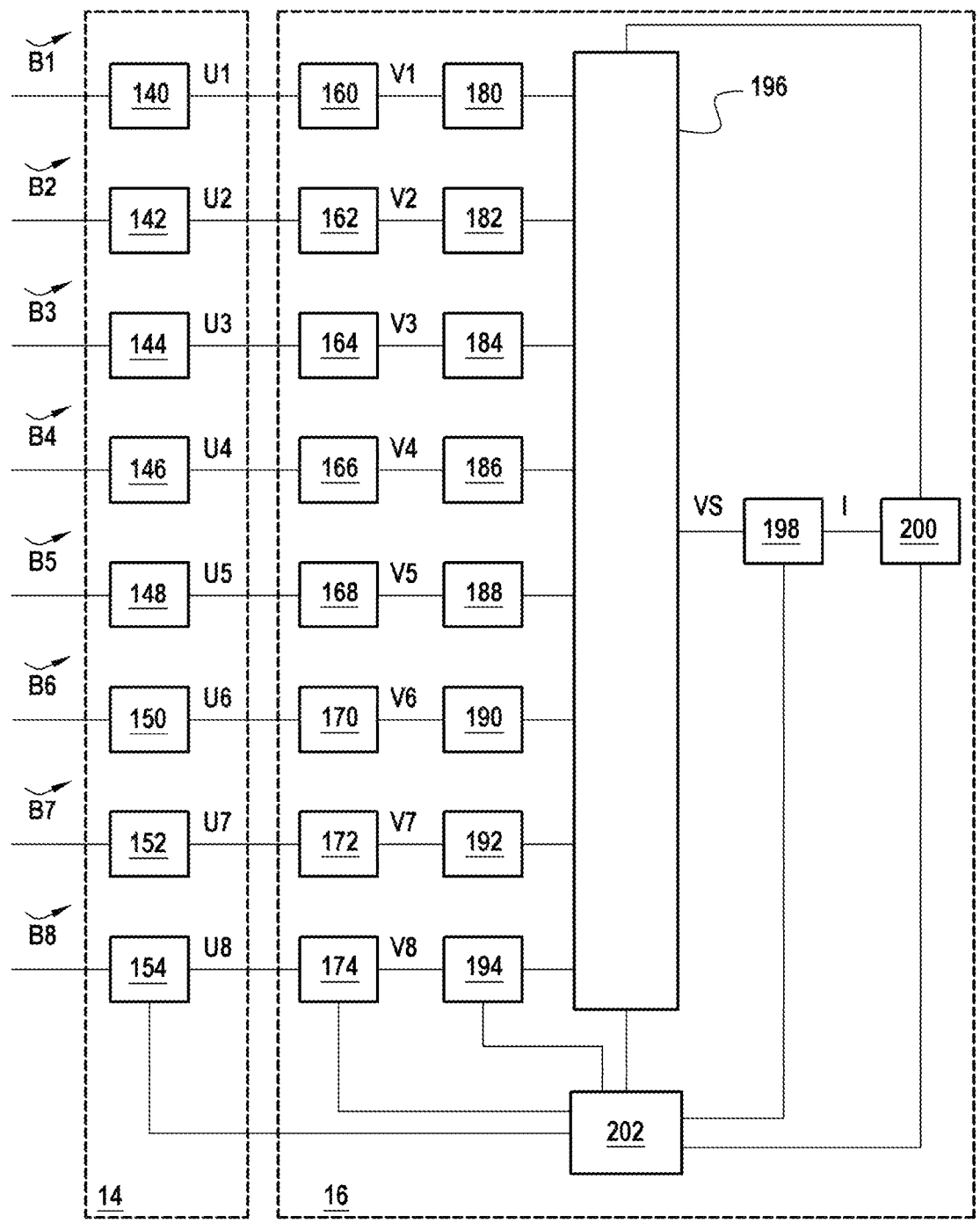

[Fig. 3]
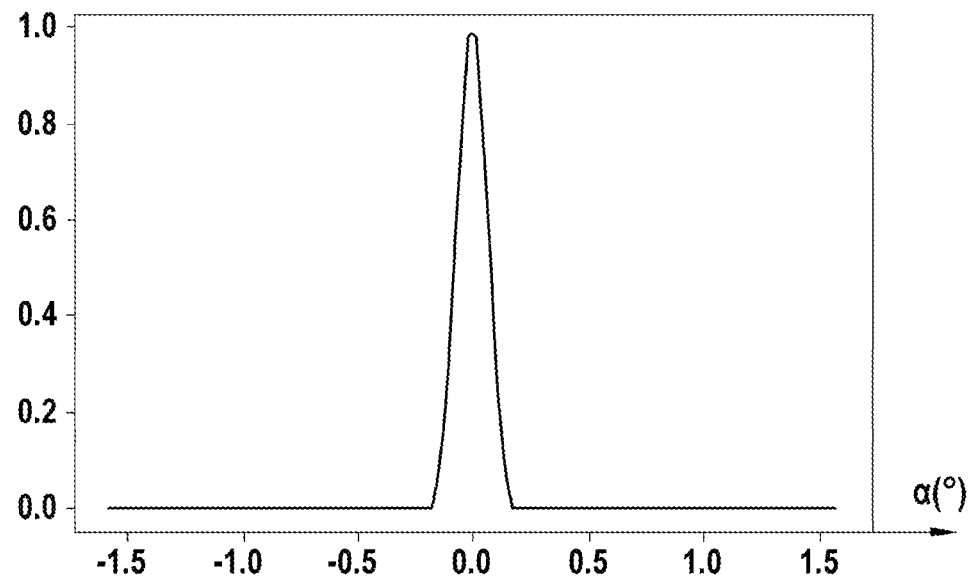
[Fig. 4]
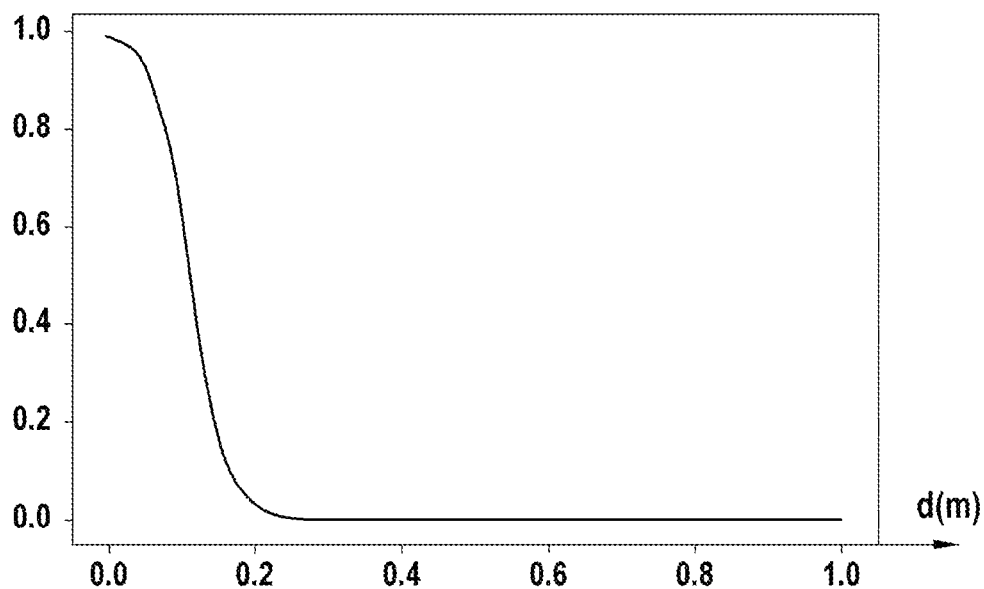

[Fig. 5]
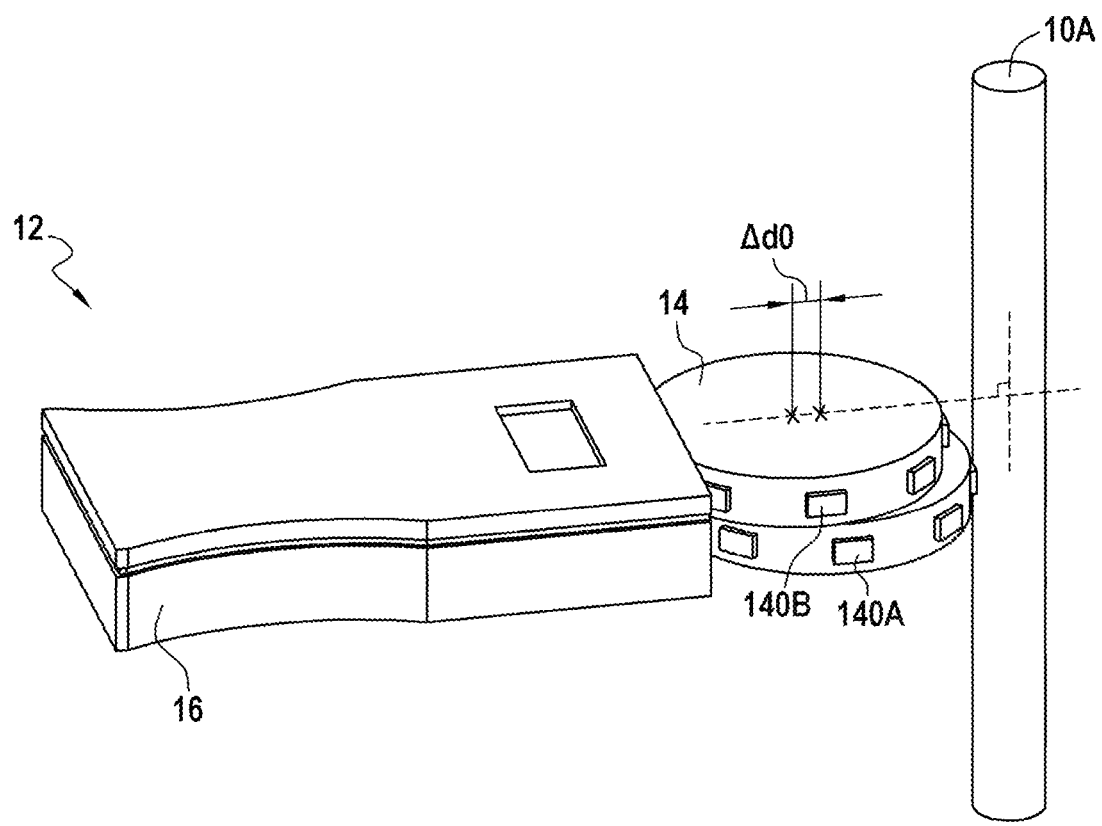

PORTABLE DEVICE FOR CURRENT MEASUREMENT USING INDUCED MAGNETIC FIELDS

BACKGROUND

Technical Area

The present invention relates to the field of contactless current measurements and concerns particularly a measuring device using induced magnetic fields.

Prior Art

The current sensors ensuring a contactless measurement are well known, such as Hall-effect sensors, Rogowski loops, magnetoresistors, fluxgates or even magneto-optical devices. However, these sensors require surrounding the conductor through which the current to be measured passes and such a placement is not always possible or desired.

SUMMARY

The present invention therefore relates to a portable device for a current contactless measurement that does not require clamping of the conductor to make this measurement. An aim of the invention is also to prevent the current measurement from being disturbed by the other conductors present in the environment of the conductor being measured. Another aim of the invention is to obtain an accurate measurement having a large dynamics making it possible to cover a large current measurement range, typically from 1 to 100 Amps.

These aims are achieved by a portable device for a contactless measurement of a current I passing through an electrical conductor, the device including a measuring module and a processing module, the measuring module, configured to be held by an operator in contact with the conductor in a plane P substantially orthogonal to this conductor and without clamping this conductor, including a first plurality of magnetic field sensors, and the processing module being configured to perform a determined linear combination of the plurality of signals delivered by the first plurality of magnetic field sensors, so as to perform an angular spatial filtering isolating the current I to be measured from other disturbing currents passing through other conductors.

By this spatial filtering, it is possible to guarantee an angular selectivity suitable for the device in order to isolate the current sought among disturbing currents surrounding it with a minimum error (typically a maximum error of less than 1%).

Advantageously, the angular spatial filtering is performed in a predefined area of the space, limited to a circular sector defined by an angle $2\alpha$ and a radius d and centered on the electrical conductor disposed at a determined distance $r+d_0$ from a center of the first plurality of sensors, r being the radius of the first plurality of sensors, $d_0$ the measuring distance and $r+d_0 < d$.

Preferably, the measuring module includes one of the following shapes: circular, elliptical, rectangular, square, star or T shape and the magnetic field sensors are distributed around the periphery of the measuring module.

Advantageously, the magnetic field sensors have a maximum tangential and/or radial sensitivity.

Preferably, the magnetic field sensors are chosen among the following sensors: Hall-effect sensors, GMR or AMR sensors, fluxgate sensors and are 2 to 30 in number.

Advantageously, the determined linear combination constitutes a digital filter of equation $VS = \Sigma Fi \times Vi$, i being the number of sensors in the measuring module, and whose weighting coefficients Fi are obtained from two predetermined templates representing the desired angular spatial filtering.

Preferably, the processing module is configured to reconstruct an image in the plane P of the angular disposition of the magnetic sources formed by the other conductors present around the measuring module. When each magnetic sensor is formed of three identical sensors disposed orthogonally, the processing module can be configured to reconstruct an image of the magnetic environment around the measuring module.

Advantageously, in order to cover a larger current measurement range, the magnetic field sensors alternate between high-sensitivity sensors of the fluxgate type and low-sensitivity sensors of the Hall-effect type.

Preferably, in order to determine the measuring distance $d_0$, the measuring device may include a retractable sensing finger disposed at the end of the processing module and having a rest position and a deployed position, the switching between these two positions distant by a predetermined distance being made by a push button actuatable by the operator or include a second plurality of magnetic field sensors whose center is spaced at a predetermined distance $\Delta d_0$ from the center of the first plurality of sensors.

BRIEF DESCRIPTION OF THE DRAWINGS

Other characteristics and advantages of the present invention will emerge from the description given below, with reference to the appended drawings which illustrate an exemplary embodiment thereof without any limitation and on which:

FIG. 1 schematically represents in perspective a first example of a current measuring device according to the invention, FIG. 2 is a block diagram of the processing implemented in the current measuring device of FIG. 1, FIG. 3 is the result of a filtering with a first template on $\alpha$ used in the processing of the current measuring device according to the invention, FIG. 4 is the result of a filtering with a second template on d used in the processing of the current measuring device according to the invention, and FIG. 5 illustrates in perspective a second example of a current measuring device according to the invention.

DETAILED DESCRIPTION OF THE EMBODIMENTS

In FIG. 1, facing and at a distance from a conductor 10A whose current I passing therethrough is sought to be measured without clamping said conductor, there is positioned, in a plane P orthogonal to this conductor, a first example of a portable device 12 for a contactless current measurement according to the invention. The instrumented conductor 10A is for example disposed next to two other conductors 10B, 10C in the same plane perpendicular to the plane P. These two conductors are also traversed by currents and constitute disturbing elements for measuring the current I passing through the instrumented conductor 10A.

According to the invention, the measuring device essentially includes a measuring module 14 and a processing module 16, the measuring module being disposed at the end of the processing module which has externally advantageously the shape of a handle allowing easy grip by an operator making the measurement.

The measuring module 14 consists of a plurality of sensors sensitive to magnetic fields, comprised between 2 and 30 and typically 8, forming a constellation and distributed over 360°, preferably evenly around the periphery of this module. The position of each of the sensors, whether they are evenly or unevenly distributed, is known with accuracy, and together they do not ensure a clamping of the conductor of interest, unlike the devices of the prior art.

The magnetic field sensors that can be used for this module are typically Hall-effect sensors, sensors called XMR sensors, that is to say anisotropic magnetoresistance (AMR) or giant magnetoresistance (GMR) sensors or fluxgate sensors.

In the illustrated example, this measuring module has a substantially circular shape but an elliptical or square shape is also possible. Likewise, a cross or T shape could be envisaged, the bar and the leg of the T being disposed in the plane normal to the conductor of interest, the choice of the most appropriate shape resulting from the used type of sensors and from the desired performances, in particular in terms of filtering of the magnetic signals derived from these sensors.

Since the sensors, regardless of their types, generally have a preferred measuring orientation or an axis of maximum sensitivity, sensors that are sensitive tangentially to the measuring module should be preferably sought.

However, a radial orientation (in the case of a circular, elliptical or square constellation) can be envisaged so that a joint use in the same module, of sensors with radial orientation and tangential orientation is also possible.

The processing module 16 is now described in relation to FIG. 2 which shows a simplified block diagram of this module that receives from each of the sensors 140-154 (that is to say 8 sensors in the non-limiting example illustrated) forming the constellation of the measuring module 14, a first voltage U1-U8 representative of the magnetic field B1-B8 recorded at each of these sensors. This voltage U1-U8 is delivered to a gain compensation circuit 160-174 which allows compensating for the various gain dispersions inherent in each of the sensors and which delivers a second normalized voltage V1-V8.

Depending on the type of sensor, for example when using AMR sensors that have very low output voltages (on the order of a few millivolts), this gain compensation circuit can also ensure amplification of the received signal.

Each of the second normalized and possibly amplified voltages V1-V8 is then digitized in an analog-to-digital converter 180-194 before being communicated to a processing unit 196 of the microcontroller type (for example the STM32 from the STM Microelectronics company integrating random access and flash memories) or the like (ASIC or FPGA for example) in which these voltages will be processed by an appropriate digital filtering, as will be explained later, to restore a voltage $V_S$ characteristic of the field signal corresponding to the single magnetic field emitted by the current I passing through the conductor 10A.

A final calibration circuit 198 makes it possible to switch from this voltage value to that of the current measured according to an equation of known proportion $$Imes = \frac{2\pi K cal d_0}{\mu_0} Vs$$

where $\mu_0$ is the permeability in a vacuum, $d_0$ is the measuring distance and Kcal is a calibration parameter determined beforehand in factory by tests based on a known calibrated current (typically 1 A) and on disturbing currents also known (for example varying from 10 to 400 A). The determination of the measuring distance do can for example be made by means of a sensing device as will be described later.

The thus determined current I is then converted into a root-mean-square value and displayed on a display 200 of the device (other parameters such as the frequency and the continuous mean value can optionally also be displayed). All of these components are obviously powered by a rechargeable or non-rechargeable battery 202, typically 5V, whose charge level is for example visible on the display screen which is preferably tactile. In conjunction with the microcontroller, this screen can also display a number of other states making it possible to verify the correct operation of the device.

In accordance with the invention, the digital filtering performed in the processing unit 196 consists of a determined linear combination of the normalized voltage values Vi representative of the magnetic fields recorded by the various sensors, namely VS=ΣFi×Vi, i being the number of sensors in the measuring module.

In the example illustrated in FIG. 1 of a constellation of eight sensors, the following relation is obtained corresponding to a filter of order 8 of weighting coefficients F1 to F8:

VS=F1V1+F2V2+F3V3+F4V4+F5V5+F6V6+F7V7+F8V8

This determined linear combination tends to perform an angular spatial filtering making it possible to isolate the current I to be measured from disturbing currents passing through other conductors than the conductor of interest. This angular spatial filtering has the property of being sensitive only to the fields emitted by conductors located in a predefined region of the space defined as the passing space area. This passing area is advantageously a circular sector of angle $2\alpha$ ($-\alpha,+\alpha$) and of radius d, centered on the targeted conductor (present at $\alpha=0$), which is disposed at a given distance $r+d_0$ from the center of the constellation of sensors (r being the radius of the constellation of sensors and $r+d_0<d$). The radius r of the constellation of sensors is preferably comprised between 1 and 5 cm, typically 3 cm and the distance do comprised between 1 and 10 mm.

In order to perform this angular spatial filtering and as shown in FIGS. 3 and 4, a spatial template is set up, making it possible to specify the behavior of the filter by a delimitation of the passing and attenuated (or cut) areas reflecting the desired sensitivity. More specifically, a first template is provided on $\alpha$ (FIG. 3 illustrates the result of the filtering) and a second template on d (FIG. 4 illustrates the result of the filtering) which can each consist of a simple rectangular gate function centered on the direction of the targeted source (typically $\alpha$ from $-\pi/2$ to $\pi/2$ and d is less than 1 m). But it is clear that a Hamming or Hanning function or any other similar windowing function like that of Blackman or Kaiser can also be envisaged.

With the two filter templates thus defined, the synthesis of the desired filter can be obtained simply by an iterative process using synthesis software known as PYTHON. More specifically, it concerns looking for an optimal combination of measurements that allows complying with these two templates representing the desired filtering (for this, field measurements given by a constellation of N sensors are available for each point of the plane). This amounts to minimizing the distance from the filter to the template via a bilinear least squares method. This calibration process, carried out conventionally in factory, allows the determination of the weighting coefficients Fi of the digital filter and depends in particular on the position and orientation of these sensors. Thus, for a circular measuring module whose constellation radius is of 3 cm including eight Hall-effect sensors evenly distributed over 360° and oriented tangentially with a measuring distance do of 3 mm, the following weighting coefficients are obtained:

$F1=F8=0.105692149; F2=F7=0.217712759;$
$F3=F6=0.378621237$ and $F4=F5=1$

In addition, in order to increase the measurement dynamics, it is advantageous to use different sensors. For example, the constellation can include both very sensitive fluxgate sensors (for example the DRV425 sensor from the Texas Instrument company) with a linear dynamics of +/−2 mT and less sensitive Hall-effect sensors but which can go up to +/−100 mT (for example the EQ733L sensor from the AKM semiconductor Inc. company). This embodiment combining low-sensitivity and high-sensitivity sensors disposed alternatively allows covering a large current measurement range (typically from 1 A to 100 A). It should be noted that these sensors can also be disposed on either side of the same electronic board so as to minimize the space required.

It will also be noted that when the constellation has a circular shape, it is possible to move, at the processing unit, by a simple set of permutation of the weighting coefficients of the digital filter, the passing space area of the directivity lobe in a circular fashion and thus to map the magnetic field in the plane of the sensor without having to modify its orientation. Indeed, the constellation remaining fixed, the passing area describes a disc therearound and thus scans the space surrounding the constellation. In this particular configuration, after a complete rotation, it is then possible to reconstruct the image of the angular disposition of the magnetic sources around the constellation and display it on the display. With three identical sensors, disposed orthogonally instead of each sensor (namely 24 sensors in a configuration similar to that of FIG. 1), the mapping becomes 3D. It becomes possible to reconstruct an image of the magnetic environment of the measuring device.

Finally, the measuring device of the invention includes a retractable sensing finger 18 also disposed at the end of the processing module 16 and which has two distinct and stable positions $d_{01}$, $d_{02}$, a rest position and a deployed position, these two positions being distant from each other only by a known $\Delta d_0$ of a few millimeters, typically 3 mm (with $d_{01}=2$ mm and $d_{02}=5$ mm).

The switching between these two positions is carried out by the operator simply by means of a push button 20 and allows determining, with the same constellation of sensors, by obtaining two current measurements on the same conductor, the measuring distance do to this conductor.

Indeed, the magnetic field is inversely proportional to the distance $d_0 \rightarrow B1$ giving an output VS1, the distance is modified $d_0 + \Delta d_0 \rightarrow B2$ giving an output VS2

$$\begin{cases} B_1 = \dfrac{A}{d_0} \\ B_2 = \dfrac{A}{(d_0 + \Delta d_0)} \end{cases}$$

The analytical solution is found by combination:

$$\dfrac{B_1}{B_2} = \dfrac{A}{d_0} \times \dfrac{(d_0 + \Delta d_0)}{A} \leftrightarrow \dfrac{B_1}{B_2} = 1 + \dfrac{\Delta d_0}{d_0}$$

Hence the solution:

$$d_0 = \dfrac{\Delta d_0}{\dfrac{B_1}{B_2} - 1} =$$

with $B_1 > B_2$ which is identical when replacing B1/B2 by VS1/VS2:

$$d_0 = \dfrac{\Delta d_0}{\dfrac{V_{s1}}{V_{s2}} - 1} =$$

with $V_{s1} > V_{s2}$

The $\Delta d_0$ is a constant of the sensing device.

It is therefore possible to determine, from different measuring voltages derived from the constellation of sensors, this distance $d_0$, the actual measuring distance which will allow, if necessary, correcting the various measurements (the measuring device being previously calibrated in factory at a calibration distance which can indeed be distinct from this actual measuring distance).

It will be noted, as illustrated in FIG. 5, that this sensing device can be replaced by a second constellation of sensors 140B, whose center is distant by $\Delta d_0$ from the center of the first constellation 140A. This second example of a current measuring device according to the invention allows replacing the physical displacement of the device by an electronic switching from one constellation to another, the outermost constellation being in contact with the conductor of interest 10A.

The operation of the measuring device is particularly simple, as will be explained below. The operator having the device in hand and after making sure that the battery charge is sufficient (a simple touch on the display allows removing it from its standby state and providing this information), he places it facing the conductor whose current is to be measured, in a plane substantially orthogonal to this conductor, until it comes into contact with the retractable sensing finger. Compressing the retractable sensing finger on the conductor has the effect of automatically triggering a first magnetic field measurement by the constellation of sensors. The retraction of the sensing finger into its second stable position by the action on the push button will trigger a second magnetic field measurement allowing both the automatic determination of the distance do and that of the value of the detected current I, the display of this value being indeed performed almost instantaneously (at most a few hundred milliseconds depending on the calculation means used). When the current measuring device includes two constellations of sensors, the first and second measurements can however be made simultaneously upon contact with the conductor of interest.

The invention claimed is:

1. A portable device for a measurement of a current passing through an electrical conductor, the device comprising:
   a measuring module, and
   a processing module,
   wherein the measuring module is configured to be held by an operator and placed in a plane substantially orthogonal to the electrical conductor and without clamping of the electrical conductor or surrounding the electrical conductor,
   wherein the measuring module includes a first plurality of magnetic field sensors, and
   wherein the processing module is configured to
      perform a determined linear combination of a plurality of signals delivered by the first plurality of magnetic field sensors and
      perform an angular spatial filtering isolating the current passing through the electrical conductor from other disturbing currents passing through other conductors,
   wherein the angular spatial filtering is performed in a predefined area of space, limited to a circular sector defined by an angle and a radius d and centered on the electrical conductor disposed at a determined distance $r+d_0$ from a center of the first plurality of sensors, r being the radius of the first plurality of sensors, $d_0$ the measuring distance and $r+d_0<d$.

2. The device according to claim 1, wherein the device is configured to determine the measuring distance $d_0$, by further including a retractable sensing finger disposed at an end of the processing module, the retractable sending finger having a rest position and a deployed position, switching between the rest position and the deployed position by a predetermined distance $\Delta d_0$ being made by a push button actuatable by the operator.

3. The device according to claim 1, wherein the device further includes a second plurality of magnetic field sensors, the second plurality of magnetic field sensors having a center that is spaced at a predetermined distance $\Delta d_0$ from a center of the first plurality of sensors.

4. The device according to claim 1, wherein the measuring module includes a circular shape, an elliptical shape, a rectangular shape, a square shape, a star shape, or a T shape.

5. The device according to claim 1, wherein the first plurality of magnetic field sensors are distributed around a periphery of the measuring module.

6. The device according to claim 1, wherein the first plurality of magnetic field sensors have a maximum tangential and/or radial sensitivity.

7. The device according to claim 1, wherein the first plurality of magnetic field sensors include Hall-effect sensors, GMR or AMR sensors, or fluxgate sensors.

8. The device according to claim 1, wherein the first plurality of magnetic field sensors are 2 to 30 in number.

9. The device according to claim 1, wherein the processing module is configured to reconstruct an image in the plane substantially orthogonal to the electrical conductor of the angular disposition of the magnetic sources formed by the other electrical conductors.

10. The device according to claim 1, wherein each of the first plurality of magnetic field sensors includes three identical sensors disposed orthogonally, and the processing module is configured to reconstruct a 3D image of a magnetic environment around the measuring module.

11. The device according to claim 1, wherein the first plurality of magnetic field sensors configured to cover a larger current measurement range by alternating between high-sensitivity sensors of the fluxgate type and low-sensitivity sensors of the Hall-effect type.

12. The device according to claim 1, wherein the measuring module is configured to be held by the operator and placed in contact with the electrical conductor in the plane substantially orthogonal to the conductor and without clamping of the electrical conductor or surrounding the electrical conductor.

* * * * *